United States Patent
Piazza et al.

(10) Patent No.: US 6,740,919 B2
(45) Date of Patent: May 25, 2004

(54) RAM

(75) Inventors: Marc Piazza, Pontcharra (FR); Philippe Coronel, Barraux (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/255,392

(22) Filed: Sep. 26, 2002

(65) Prior Publication Data

US 2003/0057481 A1 Mar. 27, 2003

(30) Foreign Application Priority Data

Sep. 26, 2001 (FR) .............................. 01 12377

(51) Int. Cl.$^7$ .......................................... H01L 27/108
(52) U.S. Cl. ....................... 257/301; 257/296; 257/302; 257/304
(58) Field of Search ........................... 257/296, 301–305

(56) References Cited

U.S. PATENT DOCUMENTS

| | | | |
|---|---|---|---|
| 4,894,697 A | * | 1/1990 | Chin et al. .................. 257/302 |
| 5,045,904 A | * | 9/1991 | Kobayashi et al. ......... 257/304 |
| 5,316,962 A | | 5/1994 | Matsuo et al. |
| 5,574,299 A | | 11/1996 | Kim |
| 6,175,128 B1 | * | 1/2001 | Hakey et al. ................ 257/296 |
| 6,191,448 B1 | | 2/2001 | Forbes et al. |
| 6,294,806 B1 | | 9/2001 | Kim |
| 2002/0001913 A1 | | 1/2002 | Kim |

FOREIGN PATENT DOCUMENTS

| | | | |
|---|---|---|---|
| JP | 5-29573 A | 6/1993 | |
| JP | 07086426 A | * 3/1995 | ......... H01L/21/822 |
| JP | 8-64778 A | 7/1996 | |

* cited by examiner

*Primary Examiner*—Allan R. Wilson
(74) *Attorney, Agent, or Firm*—Lisa K. Jorgenson; William R. McClellan; Wolf, Greenfield & Sacks, P.C.

(57) ABSTRACT

A method for forming in monolithic form a DRAM-type memory, including the steps of forming, on a substrate, parallel strips including a lower insulating layer, a strongly-conductive layer, a single-crystal semiconductor layer, and an upper insulating layer; digging, perpendicularly to the strips, into the upper insulating layer and into a portion of the semiconductor layer, first and second parallel trenches, each first and second trench being shared by neighboring cells; forming, in each first trench, a first conductive line according to the strip width; forming, in each second trench, two second distinct parallel conductive lines, insulated from the peripheral layers; filling the first and second trenches with an insulating material; removing the remaining portions of the upper insulating layer; and depositing a conductive layer.

7 Claims, 7 Drawing Sheets

RAM

BACKGROUND OF THE INVENTION

1. Field of the Invention

The present invention relates to the forming of RAMs in integrated form. More specifically, the present invention relates to the forming of dynamic random access memories (DRAMs).

2. Discussion of the Related Art

Generally, a DRAM is formed of an array of elementary memory cells located at the intersection of rows (word lines) and columns (bit lines). Each elementary cell is formed of a capacitive memory point (capacitor) and of an element for controlling this memory point, generally, a MOS transistor. The gate of the MOS transistor forms the word line of the cell. The source or drain region of the control transistor is in contact with a first electrode of the capacitor, the other electrode or plate of which is common to all cells in at least one column. The drain or source region of the control transistor is integral with a bit line common to all cells in a column.

Constantly, the amount of elementary cells integrated on a given silicon surface area is desired to be increased as much as possible. For this purpose, it is desired to reduce to the smallest possible the dimensions of an elementary cell. The smallest possible dimension for a conductive line is designated with reference F. This minimum dimension is also called the minimum rule, since it corresponds to a drawing rule imposed to the designer by a used manufacturing technology. Square F2 of minimum rule F thus is the minimum surface area or unity surface area of a pattern. Elementary cells having a surface area which is four times the unity surface area could theoretically be formed. However, in practice, the cells have a much larger size.

A DRAM cell having an integration surface area which is only six times the unity surface area (6 $F^2$) has been proposed in review 2000 IEEE, IEDM, pp. 349 to 352, published on Dec. 10, 2000, in article "An orthogonal $6F^2$ Trench-Sidewall Vertical Device Cell for 4 Gb/16 Gb DRAM" by C. J. Radens et al.

FIG. 1 illustrates, in a partial simplified top view, a memory including such $6F^2$ cells. More specifically, FIG. 1 illustrates two parallel bit lines BL1, BL2. Each bit line BL1, BL2 has the width of minimum rule F, and is separated from a next bit line BL2, BL1, by twice 2F the minimum rule. Two parallel word lines WL1 and WL2 are separated by this same minimum rule F. Memory points C11, C12, C21, and C22 are formed, as described hereafter in relation with FIGS. 2A to 2E and 3, under the intersections of bit lines BL1, BL2 and word lines WL1, WL2. The $6F^2$ cell finally includes between every two word lines WL1, WL2 between two memory points C11 and C21, C12 and C22, a bit line contact BLC1, BLC2.

FIGS. 2A to 2E illustrate, in a partial simplified cross-section view along axis A—A of FIG. 1, that is, an axis running in bit line BL2, successive steps of a method for forming such a $6F^2$ cell. FIG. 3 is a cross-section view along axis B—B of FIG. 1, parallel to axis A—A, above memory points C12 and C22 sharing the same bit line BL2, but outside of this bit line. FIG. 3 corresponds to an intermediary step between those illustrated in FIGS. 2C and 2D.

As illustrated in FIG. 2A, an N-type doped region 2 is first formed, generally by epitaxy, on a semiconductor substrate 1, typically made of silicon, of a first conductivity type, conventionally type P. Region 2 is buried under a P-type surface region or well 3. Buried region 2 is intended to be used as a plate electrode of the memory point. Then, a trench 4 is dug into well 3, region 2, and substrate 1. The definition of the location and of the dimensions of trench 4 is performed by means of the first mask.

A silicon oxide insulating ring 5 is then formed on a high portion of the walls of trench 4. An insulator 6 with a high electric permittivity is then deposited on the bottom and walls of trench 4. A heavily-doped N-type peripheral region 7 is formed in substrate 1 and region 2, around the low portion of trench 4. Then, a conductive material 8, generally polysilicon, is deposited at the bottom of trench 4. An elementary memory point having an electrode 7 connected by region 2 to the similar electrodes of several cells and separated by a dielectric 6 from a second electrode 8 specific to each memory point is thus formed.

At the next steps, illustrated in FIG. 2B, insulator 5 is removed from a high portion of one of the walls of trench 4, for example, the left-hand wall. A conductive material 9, identical to material 8, generally polysilicon, is deposited and etched. Material 9 is in contact by its low portion with electrode 8. This low portion is insulated from the peripheral silicon (well 3, region 2) by ring 5. Material 9 is in contact in its high portion with well 3 along the wall from which insulator 5 has been removed. A heavily-doped N-type region 10 is formed in well 3 by diffusion from material 9.

Then, a thick insulator is formed on material 9. Insulator 11 aims at insulating material 9 from any parasitic coupling with conductive structures formed at the next steps in the upper portion of trench 4. Region 10, which is diffused from material 9, extends to the top of the structure (surface of well 3) beyond thick insulator 11.

At the newt steps, illustrated in FIG. 2C, a thin insulator 12 is formed on the exposed wall of trench 4 and on the planar horizontal surface of well 3. A heavily-doped N-type region 13 is then implanted at the surface of well 3. Then, a conductive material 14, generally polysilicon, is deposited. Material 14 is intended to be used as the control transistor gate, insulator 12 being the gate insulator between gate 14 and vertical well 3.

The result of next steps is illustrated in FIG. 3, which is a cross-section view along line B—B of FIG. 1. Well 3 has been dug into, as well as a portion of the multiple-layer formed in trench 4, to open a shallow insulating trench 15 (STI) filled with an insulator. Insulating trench 15 is formed to extend in depth beyond contact level 9 and to reach insulating ring 5. The second mask used to dig into insulating trench 15 must thus be precisely aligned with respect to the first mask used (FIG. 2A) to dig into trench 4. The forming of insulating trenches 15 enables individualizing neighboring elementary cells.

As illustrated in FIG. 2D, gate 14 is then completed, for example, by forming a tungsten silicide layer 16 and an insulating layer 171. Then, by means of a third mask which must be precisely aligned with respect to the first and second masks, the multiple layer formed of layers 14–16–171 is etched to define (individualize) the word lines of each of the elementary cells. Gate 14–16–171 is then provided on its vertical walls with an insulating structure 172, generally of same nature as insulating layer 171. A thick interlevel insulating or dielectric layer 18 is then deposited so that its surface is substantially planar. Interlevel dielectric 18 is of different nature than the insulator forming layer 171 and vertical insulating structure 172, to be selectively etchable with respect thereto.

At the next steps, illustrated in FIG. 2E, the method carries on with the opening of interlevel dielectric 18 by means of a fourth mask, to partially expose surface regions 13. The fourth mask must again be precisely aligned with respect to the three preceding masks. A conductive material 19 is deposited on dielectric 18 to at least fill the openings. Finally, material 19 is etched by means of a fifth mask to define above dielectric 18 bit line contacts with source or drain regions 13. The central contact illustrated in FIG. 2E is contact BLC2 of FIG. 1. The alignment of the fifth mask must also be precisely performed with respect to the preceding masks.

A memory point having, as a control element, a MOS transistor with a substantially vertical channel has thus been formed, as illustrated in FIG. 2E. Heavily-doped surface region 13 forms a source region of the transistor. The drain region of the transistor is formed by region 10. This transistor includes a control gate 14 insulated from the channel region by a thin insulator 12. This control transistor enables possibly putting in contact a bit line 19 with first electrode 9-8 of a memory point having its second electrode or plate corresponding to regions 7 and 2.

Such a formation method is relatively complex due to the five masks successively used, which must be precisely aligned with respect to one another.

The use of such masks further results in the forming of elementary cells having six times the unity surface area, instead of four times as would theoretically be possible.

SUMMARY OF THE INVENTION

The present invention accordingly aims at providing a DRAM having its elementary cells occupying a smaller semiconductor surface area.

The present invention also aims at providing such a memory which is simpler to form than a memory taking up a larger surface area.

To achieve these and other objects, the present invention provides a method for forming in monolithic form a DRAM-type memory, including the steps of:
  forming, on a single-crystal semiconductor substrate, parallel strips including a lower insulating layer, a strongly-conductive layer, a single-crystal semiconductor layer, and an upper insulating layer;
  digging, perpendicularly to the strips, into the upper insulating layer and into at least a portion of the semiconductor layer, first and second parallel trenches, each of the first and second trenches being shared by neighboring cells;
  forming, in each of the first trenches, a first conductive lines according to the strip width;
  forming, in each of the second trenches, a pair of second distinct parallel conductive lines, insulated from the layers peripheral to the second trench;
  filling the first and second trenches with an insulating material;
  removing the remaining portions of the upper insulating layer; and
  depositing a conductive layer.

According to an embodiment of the present invention, the forming of the parallel strips includes the steps of:
  forming on a first single-crystal semiconductor substrate a single-crystal semiconductor layer resting on a first insulating layer;
  forming, on the semiconductor layer, a strongly-conductive layer, then a second insulating layer;
  digging parallel trenches into the second insulating layer, the strongly-conductive layer, and the semiconductor layer, to partially expose the first insulating layer;
  turning over and gluing the structure thus obtained on a second substrate; and
  removing the first substrate, whereby the first insulating layer becomes the upper layer of the structure thus formed and the second insulating layer becomes the lower layer underlying the semiconductor layer.

According to an embodiment of the present invention, the first and second trenches are dug into the upper insulating layer and at least a portion of the semiconductor layer so that the first trenches have a minimum width, and the second trenches have a width which is twice that of the first trenches, two neighboring trenches being separated by a minimum interval, each first trench being surrounded with two second trenches and each second trench being surrounded with two first trenches.

According to an embodiment of the present invention, the first and second trenches are dug into to maintain between the strongly-conductive layer and the bottom of each of the first and second trenches a given thickness of the semiconductor layer.

According to an embodiment of the present invention, the first and second trenches are dug into to partially expose the strongly-conductive layer.

According to an embodiment of the present invention, the first conductive lines at the bottom of each first trench and the pairs of second insulated conductive lines at the bottom of the second trenches are formed simultaneously.

According to an embodiment of the present invention, the simultaneous forming of the first lines and of the pairs of second lines at the bottom of the first and second trenches includes the steps of:
  depositing at the bottom and on the walls of the first and second trenches an insulating layer;
  conformally depositing a conductive material to at least fill the first trench; and
  removing the conductive material from the surface of the first insulating layer.

According to an embodiment of the present invention, the lines formed at the bottom of the first trenches are not insulated from the peripheral semiconductor and/or conductor layers.

According to an embodiment of the present invention, the forming, at the bottom of the first trenches, of lines which are not insulated from the peripheral semiconductor and/or conductive layers includes the steps of:
  conformally depositing an insulating material at the bottom and on the walls of the first and second trenches;
  conformally depositing a first sub-layer of a conductive material;
  performing a directional bombarding so that the conductive material is only bombarded on its sides in the second trenches;
  removing by selective etching the sole non-bombarded portions of the conductive material in the first trenches;
  removing the portions thus exposed of the insulating material previously deposited at the bottom of the first and second trenches;
  depositing a second sub-layer of the conductive material to at least fill the first trenches; and
  removing the conductive material from the surface of the first insulating layer.

According to an embodiment of the present invention, the method further includes, after the step of deposition of a conductive layer, the steps of:

level trimming, which results in the forming, between a first and a second neighboring trenches, of independent conductive surfaces in contact with the surface of the semiconductor layer;

depositing over the entire structure a thin dielectric with a high permittivity; and depositing over the entire structure a conductive layer.

The present invention also provides a DRAM, including:

parallel strips formed of the stacking, on a single-crystal semiconductor substrate, of an insulating layer of a strongly-conductive line, and of a semiconductor layer;

first conductive lines running perpendicularly to the strips, each in a first relatively thin trench dug into at least a portion of the semiconductor layer;

pairs of second conductive lines parallel to each other and to the first lines, each pair of second lines running in a second relatively wide trench dug into at least a portion of the semiconductor layer between two first trenches; and conductive surfaces of unity area resting on the semiconductor layer, these surfaces being defined at the surface of the strips by the intervals separating a first and a second neighboring strips.

According to an embodiment of the present invention, the first and second trenches do not reach the underlying strongly-conductive lines, the second lines being insulated with respect to the peripheral semiconductor layer and forming the word lines of the memory, the strongly-conductive lines forming the bit lines of the memory, and the surfaces of unity area forming first individual electrodes of the memory points of the memory.

According to an embodiment of the present invention, the first lines are reference biasing lines of the semiconductor layer, independent from the line pairs running in the second trenches.

According to an embodiment of the present invention, the first lines are insulated from at least the peripheral semiconductor layer.

The foregoing objects, features and advantages of the present invention will be discussed in detail in the following non-limiting description of specific embodiments in connection with the accompanying drawings.

DETAILED DESCRIPTION

For clarity, the same elements have been designated with the same references in the different drawings. Further, as usual in the representation of integrated circuits, the different drawings are not to scale.

Figure 1:
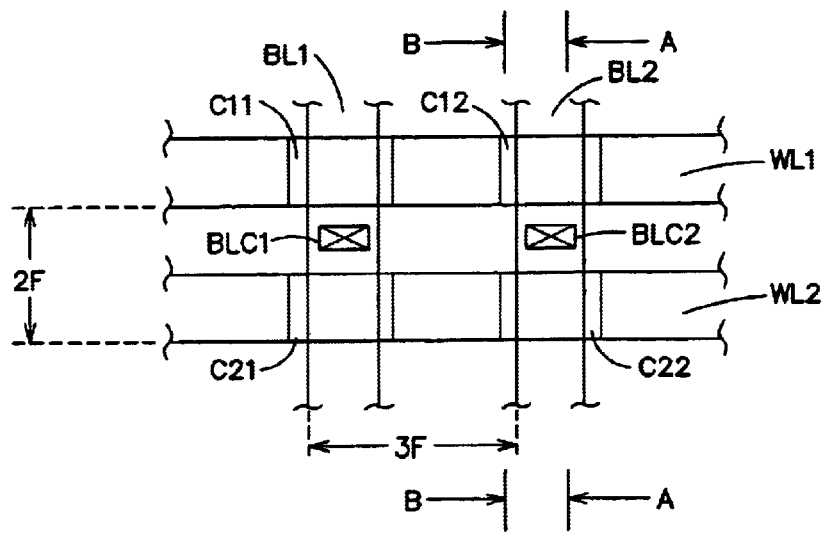
FIG. 1 illustrates, in a partial simplified top view, a memory including known DRAM cells.
Figure 2A:
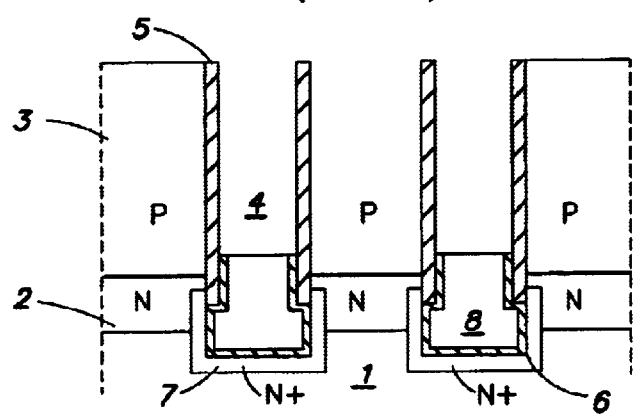
FIGS. 2A to 2E illustrate, in a partial simplified cross-section view along axis A—A of FIG. 1, successive steps of a method for forming a known DRAM cell.
Figure 2B:
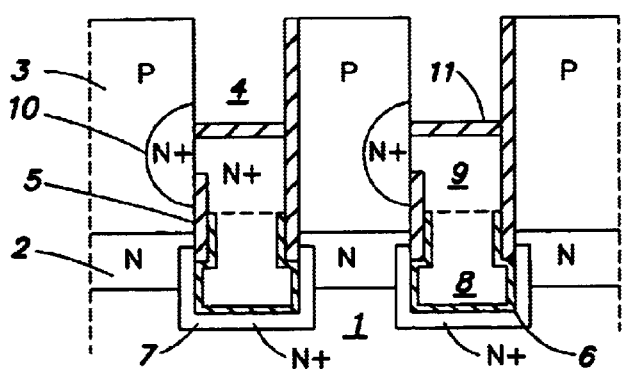
Figure 2C:
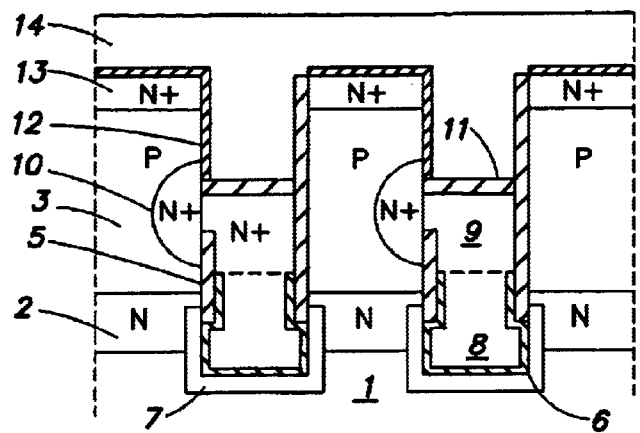
Figure 3:
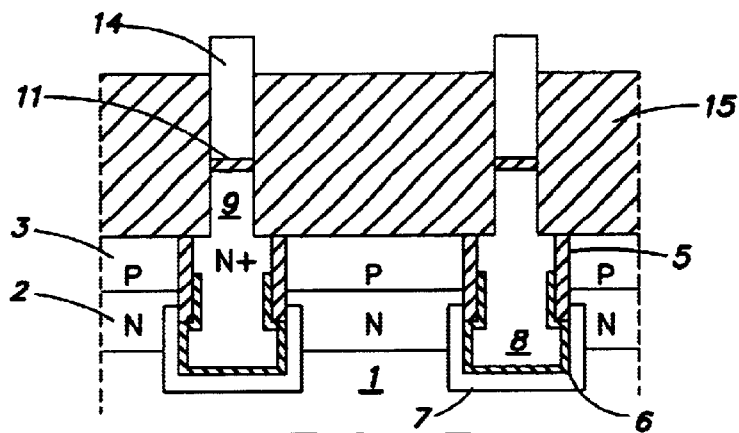
FIG. 3 illustrates, in a partial simplified cross-section view along axis B—B of FIG. 1, intermediary steps between the steps illustrated in FIGS. 2C and 2D.
Figure 2D:
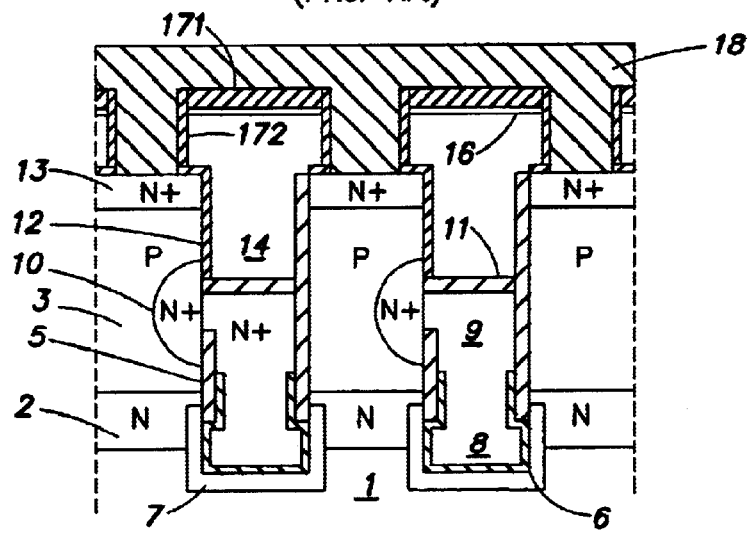
Figure 2E:
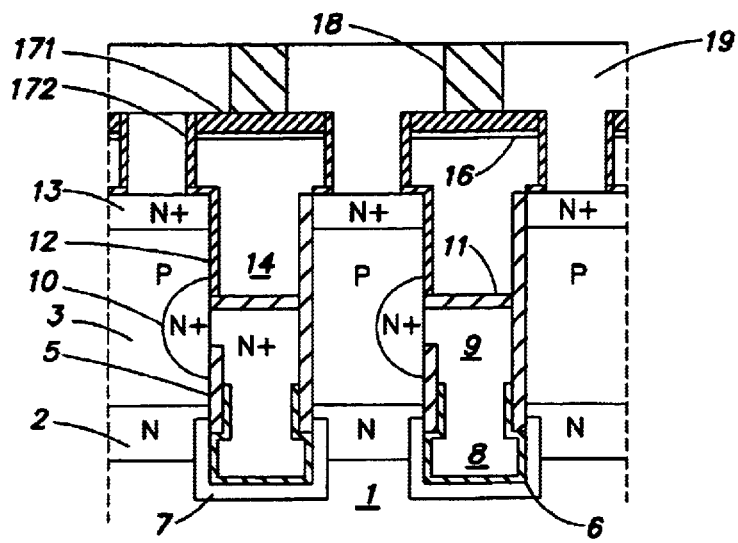
Figure 4A:
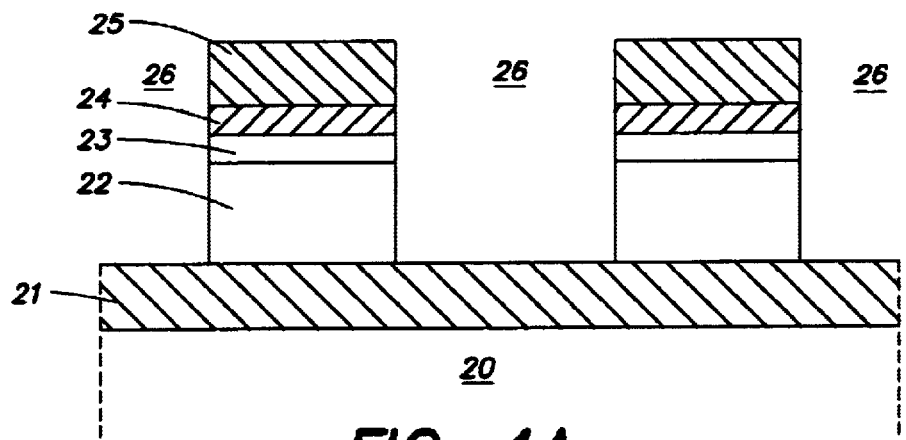
FIGS. 4A to 4C illustrate, in a partial simplified cross-section view, steps of the forming of a DRAM array according to an embodiment of the present invention.

The DRAM cell manufacturing method according to the present invention starts, as illustrated in FIG. 4A, with the forming, on a single-crystal semiconductor substrate 20, of a single-crystal semiconductor layer 22 on insulator (SOI). A multiple-layer formed of a first insulating layer 21 and of a semiconductor layer 22 is thus obtained on substrate 20. A strongly-conductive layer 23, preferably a metal or a metal alloy, is then formed on semiconductor layer 22. A second, relatively thick, insulating layer 24 is then deposited. Second insulating layer 24 is deposited so that its upper surface is substantially planar.

Then, a third sacrificial insulating layer 25 is deposited. Parallel trenches 26 are dug into the multiple-layer formed of single-crystal layer 22, of layer 23, and of insulating layer 24 by means of a first mask, to partially expose insulating layer 21. Trenches 26 have a minimum width, equal to drawing rule F, and separate strips having an also minimum width, equal to rule F.

Figure 4B:
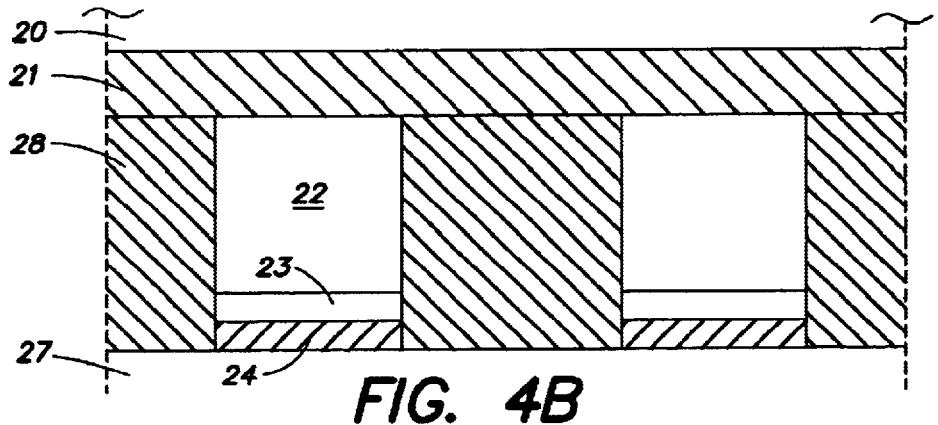

At the next steps, illustrated in FIG. 4B, the entire structure shown in FIG. 4A is turned over and glued on a second single-crystal semiconductor substrate 27. A series of strips formed of insulating layer 24, conductive layer 23, and semiconductor layer 22 supporting first insulating layer 21 and first substrate 20 are thus obtained on second substrate 27.

According to the embodiment shown in FIG. 4B, before turning over the structure of FIG. 4A, trenches 26 are filled with an insulator 28. After the deposition of insulator 28 and before turning over, the entire structure is leveled, for example by means of a chem-mech polishing, to guarantee a substantially planar surface to ease the gluing on second substrate 27. According to an alternative, not shown, the intervals (trenches 26) between distinct strips are maintained empty.

Figure 4C:
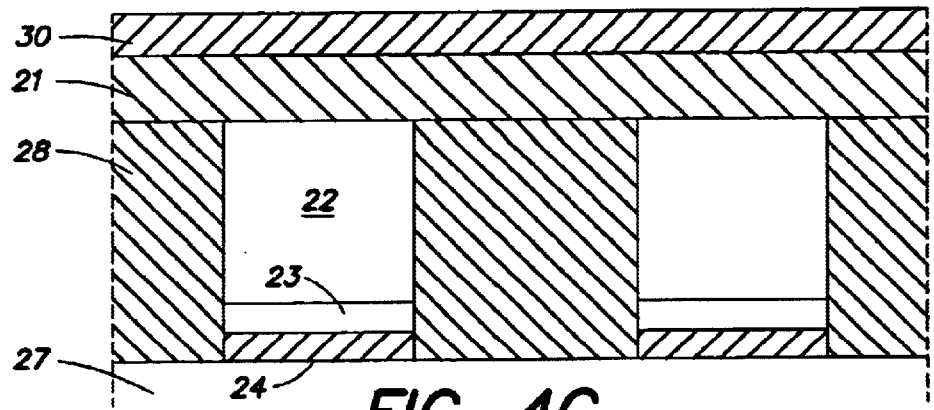

Then, as illustrated in FIG. 4C, first substrate 20, now at the top of the structure, is removed, for example by selective wet etch. First insulating layer 21 then is the upper layer of the structure. Parallel strips, each of which includes on a lower insulator 24 a conductive layer 23, a single-crystal semiconductor column 22, and an upper insulating layer 21, are thus formed.

A fourth insulating layer 30 is then deposited on first insulating layer 21. The insulator forming layer 30 is different from the insulator forming layer 21. Indeed, insulator 30 is a sacrificial insulator intended to be used as a mask.

Figure 5:
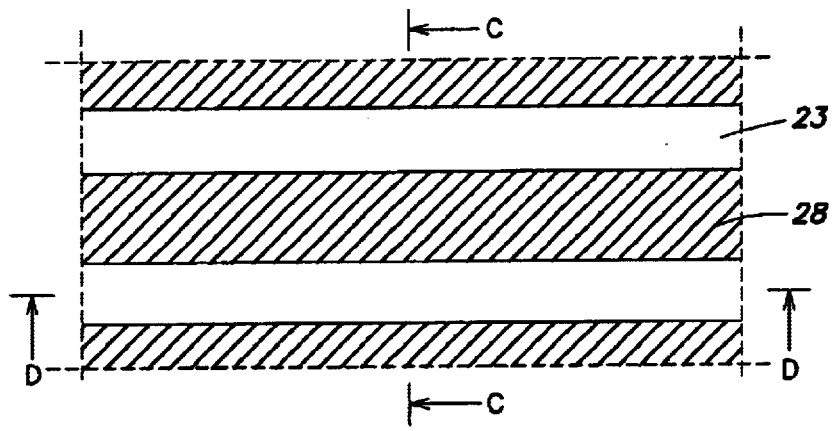
FIG. 5 illustrates, in a partial simplified top view, the state of a DRAM array according to the present invention at an intermediary state of its forming.

As partially and schematically illustrated in top view in FIG. 5, parallel independent conductive lines formed by the portions of strongly-conductive layer 23 have thus been formed. Each strongly-conductive line 23 underlies a single-crystal column 22. Two neighboring columns are separated by an insulator which is either air, or a material 28.

FIGS. 4A to 4C correspond to cross-section views along axis C—C of FIG. 5, that is, the axis perpendicular to the extension axis of lines 23. The rest of the process will now be described, in relation with FIGS. 6A to 6D, along an axis perpendicular to axis C—C, that is, an axis parallel to the extension axis of strips 24-23-22-21-30. More specifically, as illustrated in FIG. 5, an axis D—D running in such a strip 24-23-22-21-30 will be followed.

Figure 6A:
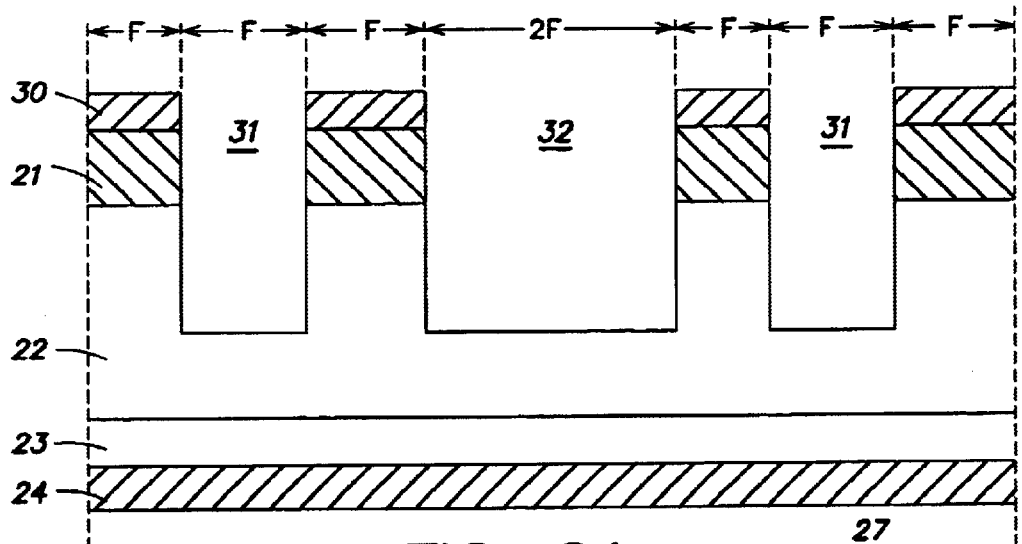
FIGS. 6A to 6D illustrate, in partial simplified cross-section views, steps of the forming of a DRAM according to an embodiment of the present invention subsequent to the steps illustrated in FIG. 4C.

FIG. 6A partially and schematically shows such a cross-section along axis D—D at the step following the deposition of the fourth layer 30 previously described in relation with FIG. 4C. According to the present invention, the fourth and first insulating layers 30 and 21, as well as single-crystal column 22, are then dug into by means of a second mask, to form parallel trenches. The trench pattern according to the present invention provides the forming of parallel trench pairs 31, 32. First trenches 31 have an opening (width) reduced to the minimum possible dimension F for a conductive line in a considered technology. Each first trench 31 is separated from second neighboring trenches by an interval substantially equal to this minimum dimension (or rule) F. Second trenches 32 are twice as wide (2F) as first trenches 31. As will better appear from the following description, each trench 31 or 32 is shared between two neighboring cells. Two first narrow trenches 31 surrounding a second wide trench 32 have been shown in FIGS. 6A–6D.

The alignment of the first digging mask of the first and second trenches 31 and 32 sets no specific alignment constraint with respect to the first digging mask of trenches 26 (FIG. 4A). More specifically, trenches 31, 32 must be formed to be perpendicular to lines 23, that is, along axis C—C of FIG. 5. As will better appear from the following description, there is no lateral alignment constraint (along axis D—D of FIG. 5).

Figure 6B:
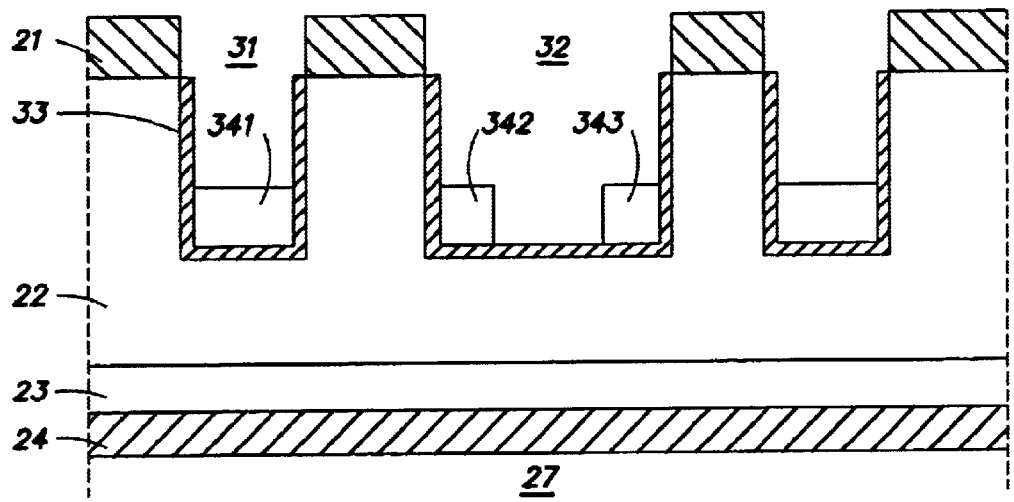

After removal of fourth insulator 30, as illustrated in FIG. 6B, a fifth insulating layer 33 is formed on the walls and the bottom of at least second wide trenches 32. Layer 33 preferably is a thin insulator.

According to an embodiment, layer 33 is also formed on the walls and the bottom of each first narrow trench 31.

Then, a layer of a conductive material is conformally deposited. This layer is etched to be removed from the surface of insulating layer 21. This removal is performed by an anisotropic etching. Thus, the conductive material is maintained in place in the first and second trenches 31 and 32 at the locations where it is the thickest and removed from the locations where it is thinner. A continuous conductive line 341 is then formed at the bottom of each narrow trench 31. At the bottom of each wide trench 32, only two distinct lateral lines 342 and 343 remain in place. Each line 342 and 343 rests on the bottom and one of the walls of trench 32, and is insulated from active substrate 22 by an insulating layer 33. Lines 341, 342, and 343 perpendicularly extend to reach underlying line 23. As should be understood by those skilled in the art, trenches 31 and 32 are dug into previously-formed parallel multiple strips 24-23-22-21. Each lines 341, 342, or 343 thus runs above all lines 23. This crossing occurs even if the digging mask of the first and second trenches 31 and 32 is laterally shifted along axis D—D of FIG. 5.

Figure 6C:
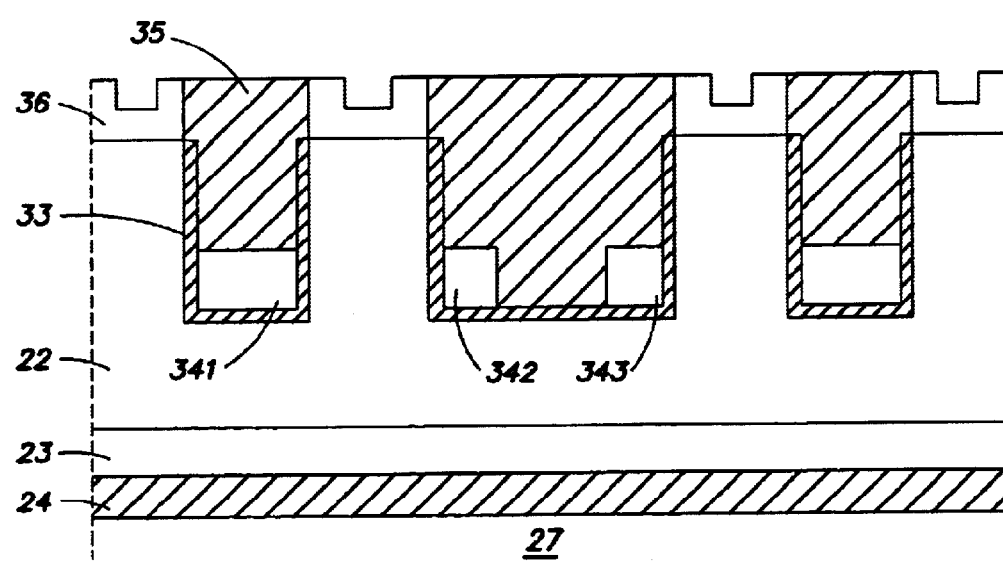

Then, as illustrated in FIG. 6C, a sixth insulator 35 is deposited, over the entire structure. Insulator 35 is deposited to fill trenches 31 and 32. For example, after deposition of a relatively thick insulating layer, a level trimming by chem-mech polishing is carried out to expose the remaining portions of first insulating layer 21. Then, first insulating layer 21 is removed. Portions of single-crystal semiconductor layer 22 are thus exposed. Each of these portions is delimited by a first narrow trench 31, by a second trench 32 along axis D—D of FIG. 5, and by interstrip insulator 28 along axis C—C of FIG. 5. The exposed portions have a surface area equal to the product of the interval between first and second trenches by the interstrip interval. They thus have a unity surface area.

A conformal deposition of a layer 36 of a conductive material is then performed. The deposition of layer 36 is followed by a chem-mech polishing. A conductive surface 36 in contact with active substrate 22 is thus individualized between two trenches 31 and 32.

Figure 6D:
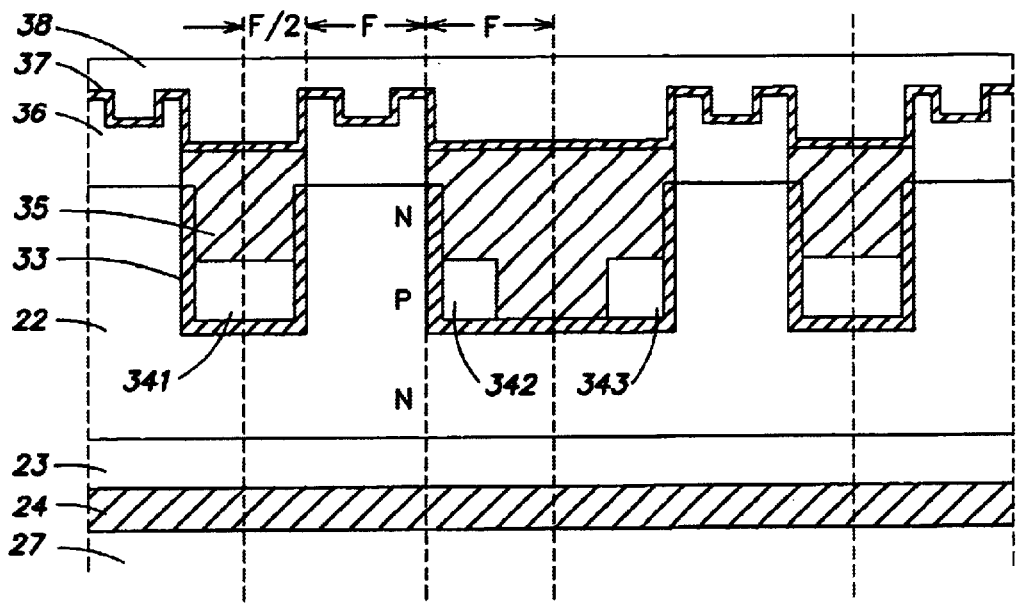

Finally, as illustrated in FIG. 6D, the structure is completed by a partial etching of sixth insulator 35, by the conformal deposition of a layer of a dielectric having a high electric permittivity 37, and by the deposition of a conductive layer 38. Conductive layer 38, preferably similar to material 36, is deposited so that its upper surface is planar. For this purpose, it will be possible to perform, after deposition of a relatively thick layer 38, a chem-mech polishing.

A DRAM having columns formed by strips and having rows formed by the lines formed in the second trenches has thus been formed. FIG. 6D illustrates two cells of a memory according to an embodiment of the present invention. Conductive surfaces of unity area 36 form the first individual electrodes of different memory points. The inter-electrode insulator is dielectric 37. The second electrode common to several memory points is layer 38.

The channel area of the control transistor of each memory point is vertical, in single-crystal column 22. It is defined by a gate 342 or 343 and a gate insulator formed by fifth insulator 33. A drain or source region is located at the surface of column 22, in contact with conductive surface 36. A source or drain region is buried in column 22 close to and in contact with line 23. The bit line is formed by line 23. It is common to all cells in a strip.

The forming of the different channel, drain, and source regions is performed by implantation in the different steps of formation. For example, upon forming by epitaxy of the single-crystal semiconductor layer 22 (FIG. 4A), a well doping is performed in situ. Then, the source or drain region intended to be (after the subsequent turning over described in relation with FIG. 4B) at the bottom of the column is formed by successive low density deposition (LDD) and high density deposition (HDD) before deposition of strongly-conductive layer 23. After the opening (FIG. 6A) of the pairs of parallel trenches 31 and 32, the well implantation is completed to give the transistor channel the appropriate doping. Then, after deposition of the conductive material in the pairs of parallel trenches 31 and 32, but before its etching (FIG. 6B) to form lines 341, 342, and 343, this material may be doped. After the etching, a low-density doping (LDD) of the drain or source region formed at the surface of column 22 is performed. Finally, after removal of first insulating layer 21 and before deposition (FIG. 6C) of conductive surface 36, a high-density doping (HDD) of the drain or source region formed at the surface of column 22 is performed.

Further, the present invention also provides a reference biasing of the channel region by line 341 formed in narrow trench 31.

It should be noted that each trench 31, 32 is advantageously shared by two memory cells. FIG. 6D illustrates, for example, two complete memory points on either side of the largest trench 32 at the center of the drawing. Each of distinct lines 342, 343 formed in this trench is the word line of a distinct elementary cell. Similarly, as for reference biasing line 341 of column 22, it ensures the biasing either directly, or by influence, as will be described in detail hereafter, of two vertical "wells" of intermediary control transistors between two trenches 31 and 32 and underlying two distinct memory points 36-37-38. Such a sharing is illustrated in FIG. 6D by the vertical dotted lines running at the center of the first and second trenches.

Due to such a sharing, a dimension of a cell according to the present invention is the sum of half of the width of a first narrow trench 31 of the interval separating a first narrow trench 31 from a wider trench 32, and of half of the width of a second trench 32. This width is thus equal to the sum of half of the minimum rule and of half of twice the minimum rule, that is, twice and a half the minimum rule (2.5 F). The other dimension of a cell according to the present invention is the standard interval between two bit lines previously illustrated in relation with FIG. 5, that is, twice (2 F) the minimum rule. The surface area taken up by a cell according to the present invention is thus five times the unity surface area (2.5 F*2 F=5 F2).

Figure 7:
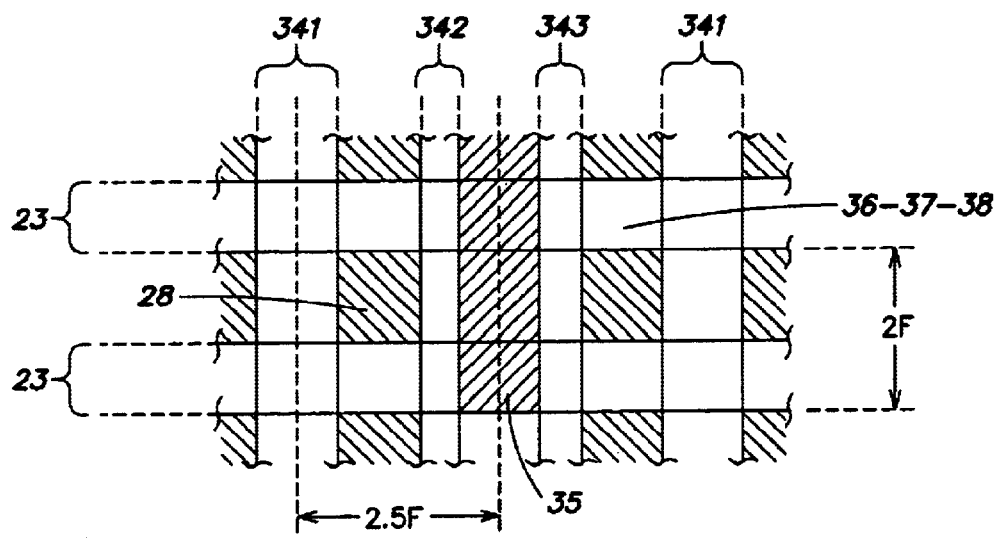
FIG. 7 illustrates, in a partial simplified top view, an embodiment of a memory according to the present invention.

FIG. 7 illustrates, in a simplified partial top view, a portion of a DRAM array according to the embodiment of the present invention previously described in relation with FIGS. 4A–C, 5, and 6A–D. Such a memory thus includes parallel bit lines 23 buried under a semiconductor layer (22, FIGS. 4 and 6) in which are formed at the bottom and at the surface of the source and drain regions of a vertical transistor. Two neighboring bit lines 23 are insulated by an insulator 28. Gates 342, 343 of the memory point (word line) control vertical transistors are perpendicular to the bit lines. Each pair of neighboring cells is also associated with a reference biasing line 341 of the substrate parallel to the word lines. Each memory point of the array is interposed between a word line and a reference line, above a bit line 23. Dimensions 2 F*2.5 F of a cell according to the present invention are clearly shown on the top view of FIG. 7.

An advantage of a method according to the present invention is that it requires use of two masks only (opening of trenches 26, opening of trenches 31, 32). All other processings are self-aligned.

Another advantage is that the alignment of the second mask with respect to the first mask is not critical. More specifically, the only constraint to be respected is a rule of perpendicularity of the two masks, which is easily acquired with a restricted number of reference marks. A possible lateral misalignment has no incidence upon the forming of the structure. Indeed, all rows (second trenches 32) crossing all the columns (strips 24-23-22) of the array define same unity surface areas specific to the forming of independent contacts 36 after removal of first insulating layer 21.

Since no alignment constraint is to be taken into account, no guard is necessary and the surface area of an elementary cell can be reduced.

The surface area of a memory cell according to the present invention obtained with such a simplified method is advantageously reduced, as described previously, to five times, 5 F2, the unity surface area.

As a non-limiting example, considering that, in present technologies, minimum rule F is on the order of from 0.16 to 0.30 μm, for example, approximately 0.20 μm, the natures and thicknesses of the various successively deposited layers are the following:

first and second substrate 20 and 27: single-crystal semiconductor substrates, for example, silicon;

first insulating layer 21 formed of
silicon oxide ($SiO_2$), formed at the surface of first substrate 20, of a thickness ranging between 40 and 400 nm, for example, on the order of 100 nm, and silicon nitride ($Si_3N_4$), of a thickness from 40 to 400 nm, for example, 100 nm;

layer 22: single-crystal semiconductor, for example, silicon, for example, of type P, of a thickness ranging between 0.3 and 0.8 μm, for example, 0.5 μm;

strongly conductive layer 23: preferably, a metal, such as a tungsten silicide layer ($WSi_2$), of a thickness ranging between 0.2 and 0.3 μm, for example, on the order of 0.22 μm;

second insulating layer 24 formed of
silicon nitride, of a thickness ranging between 0.2 and 0.3 μm, and
silicon oxide, of a thickness ranging between 0.05 and 0.1 μm;

third (sacrificial) insulating layer 25: silicon oxide, of a thickness on the order of 0.3 μm. In this case, the upper silicon oxide portion of multiple-layer 24 is removed upon removal of mask 25 (FIGS. 4A–B);

interstrip insulator 28: silicon oxide;

fourth (sacrificial) insulating layer 30 made of silicon oxide, of a thickness on the order of 0.4 μm. In this case, the silicon oxide portion (initially, the lower portion, become the upper portion after turning over and removal of first substrate 20; FIG. 4C) of multiple-layer 21 is removed upon removal of mask 30 (FIG. 6B);

trenches 31, 32: 0.4-μm depth;

fifth (gate) insulator 33: silicon oxide formed by thermal oxidation of substrate 22, of a thickness on the order of 3 nm;

conductive material of lines 341, 342, 343: polysilicon, of a thickness depending on the considered technology. The deposited thickness will be at least equal to half F/2 of the minimum rule to guarantee in the selective etching previously described in relation with FIG. 6B the forming of a continuous line 341 at the bottom of each first narrow trench 31 of a width equal to minimum rule F. However, it will be ascertained to avoid depositing to large a polysilicon thickness, to enable easy differentiation of the two distinct word lines 342, 343 running in a wide trench 32. Column 22 being made of P-type silicon in the considered example, reference biasing line 341 is biased to maintain the "well" of the vertical control transistor at ground.

sixth (filling) insulator 35: silicon oxide;

conductive material 36: polysilicon of a thickness ranging between 30 and 300 nm, for example, on the order of 100 nm;

dielectric with a high electric permittivity 37: an insulator adapted to forming the inter-electrode insulator of the memory point, for example, silicon nitride having a 5-nm thickness or tantalum oxide ($Ta_2O_5$) having a 10-nm thickness; and plate electrode 38: polysilicon. After level trimming, it will be ascertained to maintain a sufficient thickness to ensure the voltage distribution homogeneity on the order of from 200 to 400 nm, for example, approximately 250 nm.

Figure 8:
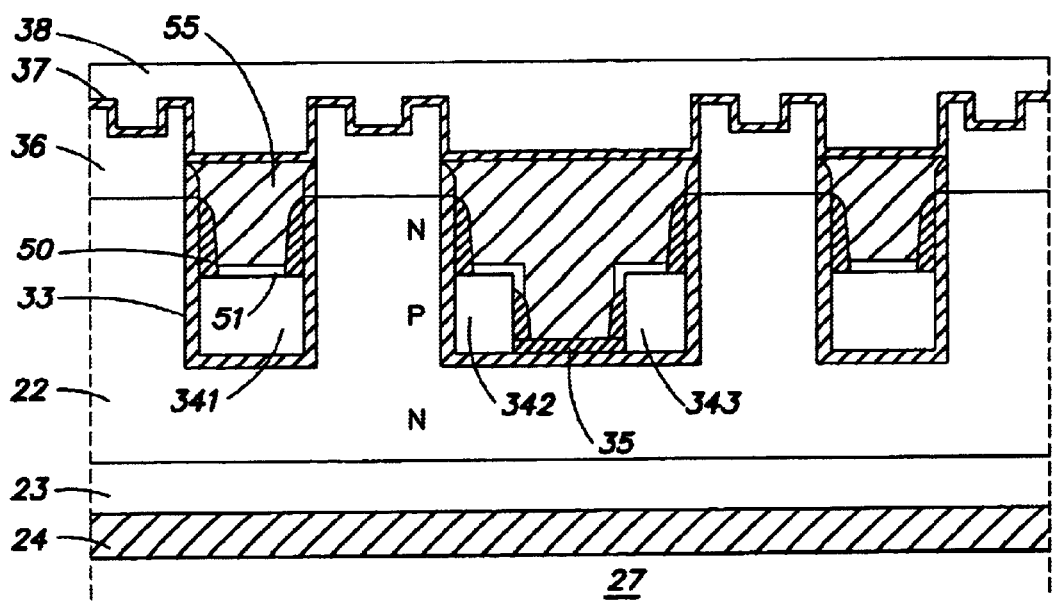
FIG. 8 illustrates, in a partial simplified cross-section view, a DRAM array according to another embodiment of the present invention.

According to an alternative, the result of which is illustrated in FIG. 8, after the step of deposition of a filling insulator 35 described previously in relation with FIG. 6B, insulating material 35 is etched to be completely removed from first trenches 31, that is, to expose the upper surface of each continuous line 341 formed at the bottom of each first trench 31. Given the increased amount of insulator 35 in each second trench 32, the upper surfaces of lines 342 and 343 are exposed, but a portion of layer 35 remains at the bottom of each second trench 32, between lines 342 and 343. A thin layer of an insulator is then conformally deposited. An anisotropic etching is then performed to remove this thin layer from the upper surface of first insulating layer 21. The vertical walls of trenches 31 and 32 and of lines 342, 343 of insulating spacers 50 are thus left in place. A strongly-conductive layer, for example, tungsten silicide 51, is then formed. Layer 51 is only formed on the surfaces of lines 341, 342, and 343 included between two spacers 50. Finally, the trenches are filled with an insulating material 55 as described previously in relation with FIG. 6B for material 35. Preferably, material 35, spacers 50, and filling material 55 are of same nature, for example, silicon oxide. Then, the method for forming a memory according to the present invention carries on, for example, as described previously in relation with FIGS. 6C and 6D.

An advantage of the specific embodiment described with FIGS. 4 to 8 is that the transfer of an electron is performed linearly, along a vertical line, in the semiconductor column 22 underlying electrode 36. The time of access to a memory cell according to the present invention is then advantageously reduced with respect to a standard cell.

According to an alternative, not shown, it may be desirable not to keep fifth insulator 33 between column 22 and its reference biasing line 341. Then, it will be possible to deposit, after forming of fifth insulator 33, a first thin sub-layer of the line conductor, and to perform a directional ion bombarding such that only the walls of the large trenches 32 are bombarded. Then, it is possible to implement a selective wet etching such that only the non-bombarded sub-layer is removed in each first narrow trench 31. After such a removal, it is possible to selectively remove fifth insulator 33 in the sole first trenches 31. Finally, a second sub-layer of the line material will be deposited to form in each trench 31 a biasing line 341 directly in contact with the peripheral semiconductor column 22, and to increase the thickness of word lines 342 and 343 in each neighboring large trench 32. The method then carries on according to any of the embodiments described in the present description. The reference biasing of semiconductor column 22 by line 341 is then performed directly, and not by influence as in the cases where an insulator is kept at the bottom of first trench 31.

According to another alternative, if very small dimensions are reached, such as minimum dimension F, that is, on the order of 0.2 μm, it will be possible to do without a biasing control of column 22. However, first trenches 31 will then not be eliminated. Narrow trenches 31 will be maintained at their minimum dimension F and the first and second trenches 31 and 32 will be opened to form, around a single-crystal vertical well 22, a surrounding gate.

Of course, the present invention is likely to have various alterations, modifications, and improvements which will readily occur to those skilled in the art. In particular, those skilled in the art will know how to adapt the doping levels and the implantation conditions to obtain a desired operation. Further, when a conductivity type has been indicated, this conductivity type does not aim at limiting the present invention to this specific type. An operation with opposite conductivity types would be possible.

Further, when examples of materials and/or dimension have been indicated, these examples do not aim at limiting the present invention. Only the insulating, semiconductor, or conductor character of the described materials is to be considered and those skilled in the art will know how to modify the materials used according to a considered technology. Similarly, each single-layer may be replaced with a multi-layer structure. Similarly, any multilayer structure may be replaced with a single-layer structure or a structure including more sub-layers than in the described examples.

Those skilled in the art will also know how to use substrate 27 underlying a memory according to the present invention to form circuits peripheral to this memory, outside of the area taken up by said memory.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A DRAM, including:
    parallel strips formed of the stacking, on a single-crystal semiconductor substrate, of an insulating layer, a strongly-conductive line, and a semiconductor layer;
    first conductive lines running perpendicularly to the strips, each in a first relatively thin formed in at least a portion of the semiconductor layer;
    pairs of second conductive lines parallel to each other and to the first conductive lines, each pair of second lines running in a second relatively wide trench formed in at least a portion of the semiconductor layer between two first trenches; and
    conductive surfaces of unity area resting on the semiconductor layer, these surfaces being defined at the surface of strips by intervals separating first and second neighboring strips.

2. The DRAM of claim 1, wherein the first and second trenches do not reach the underlying strongly-conductive lines, the second conductive lines being insulated with respect to the peripheral semiconductor layer and forming word lines of the memory, the strongly-conductive lines forming bit lines of the memory, and the conductive surfaces of unity area forming first individual electrodes of memory points of the memory.

3. The DRAM of claim 2, wherein the first conductive lines are reference biasing lines of the semiconductor layer, independent from the second conductive line pairs running in the second trenches.

4. The DRAM of claim 2, wherein the first conductive lines are insulated from at least the peripheral semiconductor layer.

5. A monolithic DRAM-type memory comprising:
    parallel strips formed, on a single crystal semiconductor substrate, of an insulating layer, a strongly conductive line and a semiconductor layer;
    first conductive lines perpendicular to the strips, each in a first trench formed in at least a portion of the semiconductor layer;
    pairs of second conductive lines parallel to each other and to the first conductive lines, each par of second conductive lines in a second trench formed in at least a portion of the semiconductor layer between two first trenches; and
    conductive surfaces on the semiconductor layer, the conductive surfaces being defined at the surface of the strips by intervals seperating first and second neighboring strips.

6. A DRAM-type memory as defined in claim 5, wherein the first and second trenches do not reach the underlying strongly-conductive lines, the second conductive lines being insulating with respect to the semiconductor layer and forming word lines of the memory, the strongly-conductive lines forming bit lines of the memory, and the conductive surfaces forming electrodes of memory points of the memory.

7. A DRAM-type memory as defined in claim 6, wherein the first conductive lines are reference biasing lines of the semiconductor layer.

* * * * *

UNITED STATES PATENT AND TRADEMARK OFFICE
CERTIFICATE OF CORRECTION

PATENT NO.    : 6,740,919 B2
DATED         : May 25, 2004
INVENTOR(S)   : Marc Piazza and Philippe Coronel It is certified that error appears in the above-identified patent and that said Letters Patent is hereby corrected as shown below:

Column 12,
Line 16, should read -- strips, each in a first relatively thin trench formed in at least a --
Line 25, should read -- of the strips by intervals separating first and -second neigh- --
Line 48, should read -- to the first conductive lines, each pair of second con- --
Line 54, should read -- strips by intervals separating first and second neigh- --

Signed and Sealed this

Thirtieth Day of November, 2004

JON W. DUDAS
*Director of the United States Patent and Trademark Office*